(12) United States Patent
Zhai et al.

(10) Patent No.: US 10,827,653 B2
(45) Date of Patent: Nov. 3, 2020

(54) THERMAL MANAGEMENT SYSTEM

(71) Applicant: EMC IP Holding Company, LLC, Hopkinton, MA (US)

(72) Inventors: Haifang Zhai, Shanghai (CN); Xizhi Cui, Shanghai (CN)

(73) Assignee: EMC IP Holding Company, LLC, Hopkinton, MA (US)

( * ) Notice: Subject to any disclaimer, the term of this patent is extended or adjusted under 35 U.S.C. 154(b) by 176 days.

(21) Appl. No.: 16/044,708

(22) Filed: Jul. 25, 2018

(65) Prior Publication Data

US 2019/0037735 A1    Jan. 31, 2019

(30) Foreign Application Priority Data

Jul. 27, 2017 (CN) .......................... 2017 1 0626394

(51) Int. Cl.
| | |
|---|---|
| *H01M 10/637* | (2014.01) |
| *H05K 7/20* | (2006.01) |
| *H01M 10/48* | (2006.01) |
| *H01M 2/10* | (2006.01) |
| *H01M 10/42* | (2006.01) |
| *H05K 7/14* | (2006.01) |
| *H01M 10/6571* | (2014.01) |
| *G06F 1/20* | (2006.01) |
| *H01M 10/615* | (2014.01) |
| *H01M 10/63* | (2014.01) |

(52) U.S. Cl.
CPC ......... *H05K 7/20836* (2013.01); *G06F 1/206* (2013.01); *H01M 2/1016* (2013.01); *H01M 10/425* (2013.01); *H01M 10/486* (2013.01); *H01M 10/615* (2015.04); *H01M 10/63* (2015.04); *H01M 10/6571* (2015.04); *H05K 7/1492* (2013.01); *H05K 7/1495* (2013.01); *H05K 7/20709* (2013.01); *H01M 2010/4271* (2013.01)

(58) Field of Classification Search
CPC .......................... H01M 10/443; H01M 10/637
See application file for complete search history.

(56) References Cited

U.S. PATENT DOCUMENTS 5,805,428 A * 9/1998 Singer .................. H05K 1/0295
174/261
6,002,240 A * 12/1999 McMahan ............... B60L 58/27
320/150

* cited by examiner

*Primary Examiner* — Olatunji A Godo
(74) *Attorney, Agent, or Firm* — Brian J. Colandreo; Mark H. Whittenberger; Holland & Knight LLP

(57) ABSTRACT

A thermal management system includes one or more heating elements positioned proximate a battery pack. A temperature sensor is configured to determine a battery temperature for the battery pack. A controller is configured to: compare the battery temperature to a desired set point, and if the battery temperature is below the desired set point, energize the one or more heating elements positioned proximate the battery pack to raise the temperature of the battery pack.

17 Claims, 5 Drawing Sheets

THERMAL MANAGEMENT SYSTEM

RELATED APPLICATION

The subject application claims the priority of China Patent Application No. 201710626394.5, filed on 27 Jul. 2017, the contents of which are herein incorporated by reference in its entirety.

TECHNICAL FIELD

This disclosure relates to thermal management systems and, more particularly, to thermal management systems for use with battery backup devices.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes and in the interest of high availability, the various IT components mounted within IT racks utilize system-level battery backup devices so that, in the event of a loss of power, any data that is stored on volatile memory (e.g., random access memory) may be written to non-volatile memory (e.g., flash memory).

SUMMARY OF DISCLOSURE

In one implementation, a thermal management system includes one or more heating elements positioned proximate a battery pack. A temperature sensor is configured to determine a battery temperature for the battery pack. A controller is configured to: compare the battery temperature to a desired set point, and if the battery temperature is below the desired set point, energize the one or more heating elements positioned proximate the battery pack to raise the temperature of the battery pack.

One or more of the following features may be included. The controller may be further configured to deenergize the one or more heating elements positioned proximate the battery pack if the battery temperature is at or above the desired set point. A thermally-conductive pad may be positioned between the one or more heating elements and the battery pack. A printed circuit board may be configured to position the one or more heating elements proximate the battery pack. A thermally-insulating pad may be positioned between the one or more heating elements and the printed circuit board. The battery pack may be a lithium-ion battery pack. The battery pack may be configured to provide electrical power to a volatile memory system during a data storage operation. The battery pack may be configured to provide electrical power to a volatile memory system in the event of a power failure event. The one or more heating elements may be resistive heating elements. The battery pack, the one or more heating elements, the temperature sensor and the controller may be included within a battery module. The battery module may include an outer protective layer. Comparing the battery temperature to a desired set point may include repeatedly comparing the battery temperature to the desired set point at a defined frequency.

In another implementation, a thermal management system includes one or more heating elements positioned proximate a battery pack. A temperature sensor is configured to determine a battery temperature for the battery pack. A controller is configured to: compare the battery temperature to a desired set point, if the battery temperature is below the desired set point, energize the one or more heating elements positioned proximate the battery pack to raise the temperature of the battery pack, and if the battery temperature is at or above the desired set point, deenergize the one or more heating elements positioned proximate the battery pack.

One or more of the following features may be included. The battery pack may be a lithium-ion battery pack. The battery pack may be configured to provide electrical power to a volatile memory system during a data storage operation. The battery pack may be configured to provide electrical power to a volatile memory system in the event of a power failure event. The one or more heating elements may be resistive heating elements.

In another implementation, a battery module includes a lithium-ion battery pack. One or more heating elements are positioned proximate the lithium-ion battery pack. A printed circuit board is configured to position the one or more heating elements proximate the lithium-ion battery pack. A temperature sensor is configured to determine a battery temperature for the lithium-ion battery pack. A controller is configured to: compare the battery temperature to a desired set point; and if the battery temperature is below the desired set point, energize the one or more heating elements positioned proximate the battery pack to raise the temperature of the lithium-ion battery pack.

One or more of the following features may be included. A thermally-conductive pad may be positioned between the one or more heating elements and the lithium-ion battery pack. A thermally-insulating pad may be positioned between the one or more heating elements and the printed circuit board.

The details of one or more implementations are set forth in the accompanying drawings and the description below. Other features and advantages will become apparent from the description, the drawings, and the claims.

BRIEF DESCRIPTION OF THE DRAWINGS

FIG. 2A is a front view of the rack-mountable computing device of FIG. 2;

Like reference symbols in the various drawings indicate like elements.

DETAILED DESCRIPTION OF THE PREFERRED EMBODIMENTS

Figure 1:
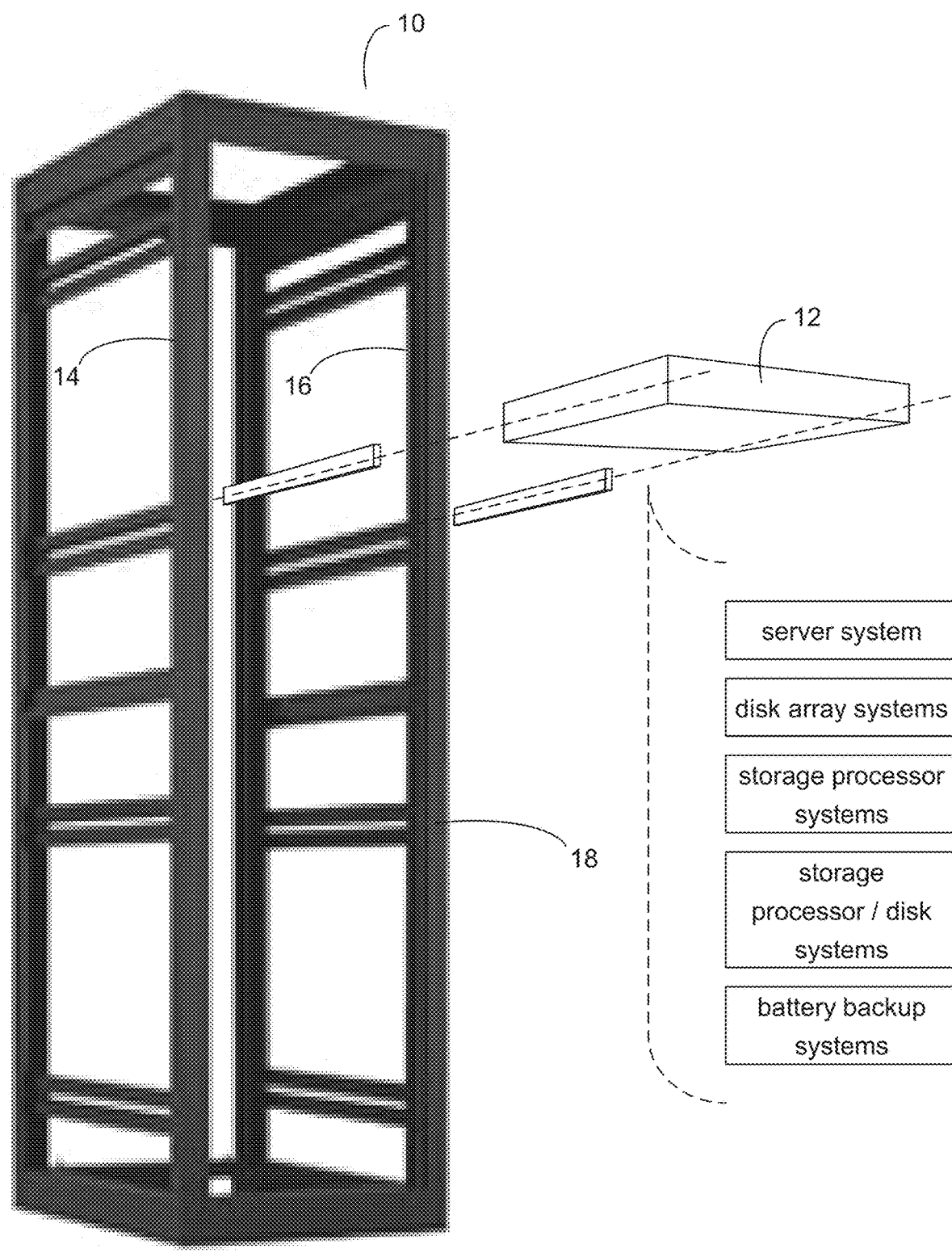
FIG. 1 is a perspective view of an IT rack and an IT component.

Referring to FIG. 1, IT racks (e.g., IT rack 10) may be utilized to store and organize IT components. For example, IT rack 10 may be placed within a computer room and various IT components (e.g., IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components that are configured to fit within IT rack 10 may be described as rack-mountable IT components.

Examples of the various IT components (e.g., IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components within IT rack 10. By standardizing the spacing between NEMA rails 14, 16, the various IT components that fit within a first IT rack may also fit within a second IT rack.

Typically, IT racks are defined in accordance with the number of rack units (U's) included within the rack. For example, a 1U IT component is half as high as a 2U IT component, which is half as high as a 4U IT component. Accordingly, while the number of rack units available within a particular IT rack may be rigidly defined by the size of the IT rack, the number of IT components mountable within that IT rack may vary depending upon the size (in rack units) of the particular IT components being mounted within that IT rack. Therefore, by reducing the number of rack units that a particular IT component uses within an IT rack, additional IT computing devices may be mounted within the IT rack.

While the following discussion concerns rack mountable IP components (e.g., rack-mountable computing device 50), this is for illustrative purposes only and is not intended to be a limitation of this disclosure, as other configurations are possible and are considered to be within the scope of this disclosure. For example, the following discussion may also concern commercial-grade, non-rack-mountable computing devices or consumer-grade computing devices.

Figure 2:
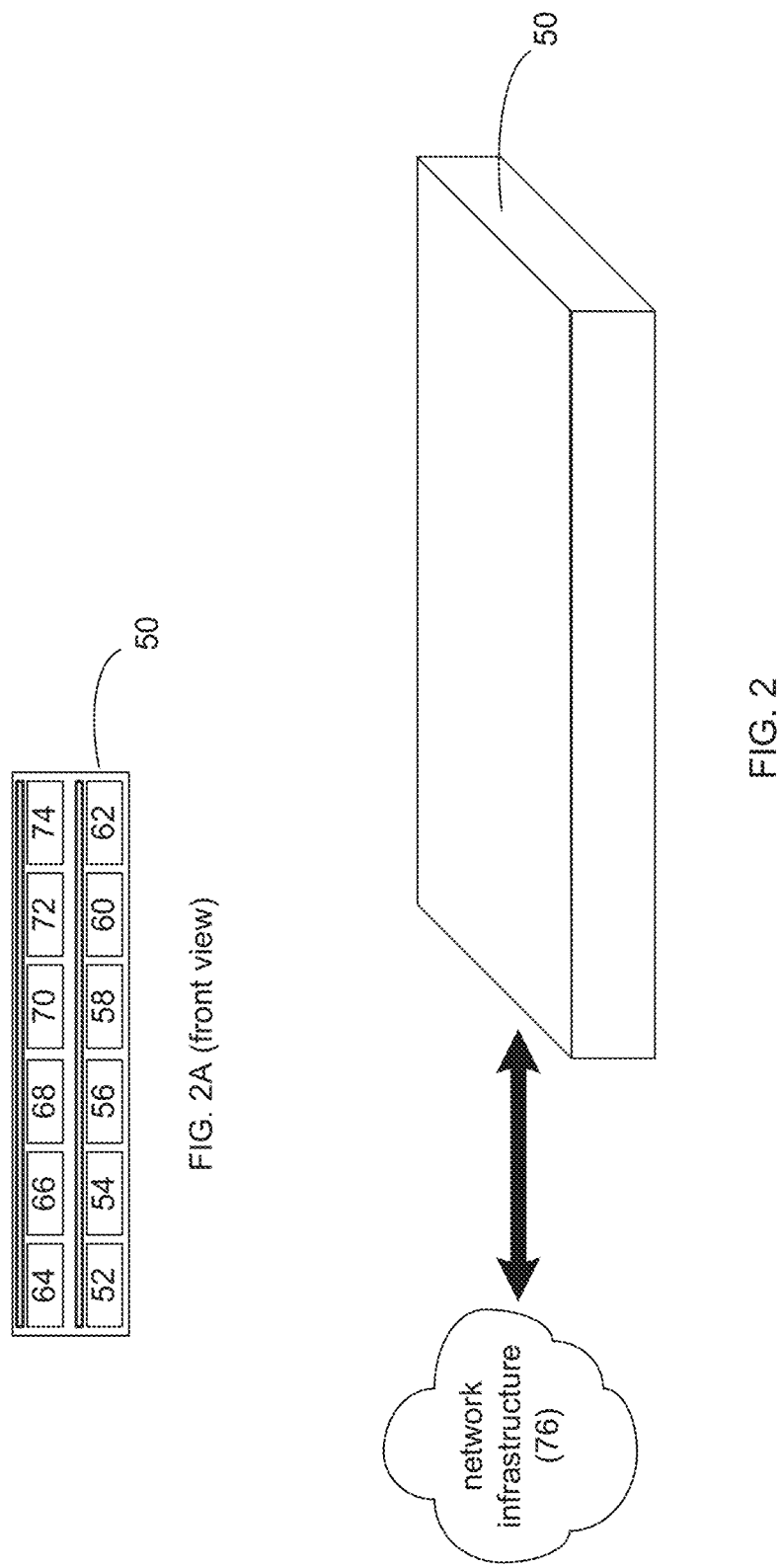
FIG. 2 is a diagrammatic view of a rack-mountable computing device for use within the IT rack of FIG. 1.

Referring to FIG. 2, there is shown one example of IT component 12, namely rack-mountable computing device 50. In this particular embodiment, rack-mountable computing device 50 may include a plurality of individual components, examples of which may include but are not limited to storage components, input/output components, and processing components.

Storage components may be the portion of rack-mountable computing device 50 that is configured to store data. Examples of such data may include but are not limited to data that is generated remotely (e.g., by applications that are executed on remote devices) or data that is generated locally (e.g., by applications that are executed on rack-mountable computing device 50). Accordingly, the storage component may be configured to include one or more storage devices, examples of which may include but are not limited to one or more electro-mechanical (e.g., rotating-media) storage devices (e.g., SATA drives or SCSI drives) and/or one or more solid state storage devices (e.g., flash drives). For example and as shown in FIG. 2A, the storage component of rack-mountable computing device 50 may be configured to include (in this example) twelve 2.5 inch form factor storage devices (e.g., storage devices 52, 54, 56, 58, 60, 62, 64, 66, 68, 70, 72, 74) that are accessible through the front panel of rack-mountable computing device 50.

Input/output components of rack-mountable computing device 50 may be the portion of rack-mountable computing device 50 that is configured to couple rack-mountable computing device 50 to a network infrastructure (e.g., network infrastructure 76), wherein network infrastructure 76 may be configured to couple rack-mountable computing device 50 to other rack-mountable computing devices, other IT components (e.g., server systems, disk array systems, storage processor systems, storage processor/disk systems, and battery backup systems), other networking devices (e.g., switches, routers, bridges, wireless access points), and/or end user computing devices (e.g., desktop computers, laptop computers, notebook computers, smartphones, tablet computers, etc.). Examples of network infrastructure 76 may include but are not limited to an Ethernet infrastructure; a fiber channel infrastructure; and an infiniband infrastructure.

Processing components of rack-mountable computing device 50 may be the portion of rack-mountable computing device 50 that is configured to process data, such as data that is generated remotely (e.g., by applications that are executed on remote devices) or data that is generated locally (e.g., by applications that are executed on rack-mountable computing device 50). Accordingly, the processing components of rack-mountable computing device 50 may be configured to include one or more microprocessors.

One or more of the above-described individual components (e.g., storage components, input/output components, and processing components) included within rack-mountable computing device 50 may include and/or utilize a volatile memory system, examples of which may include but are not limited to random access memory systems, cache memory systems, buffer memory systems, and register memory systems.

Figure 3:
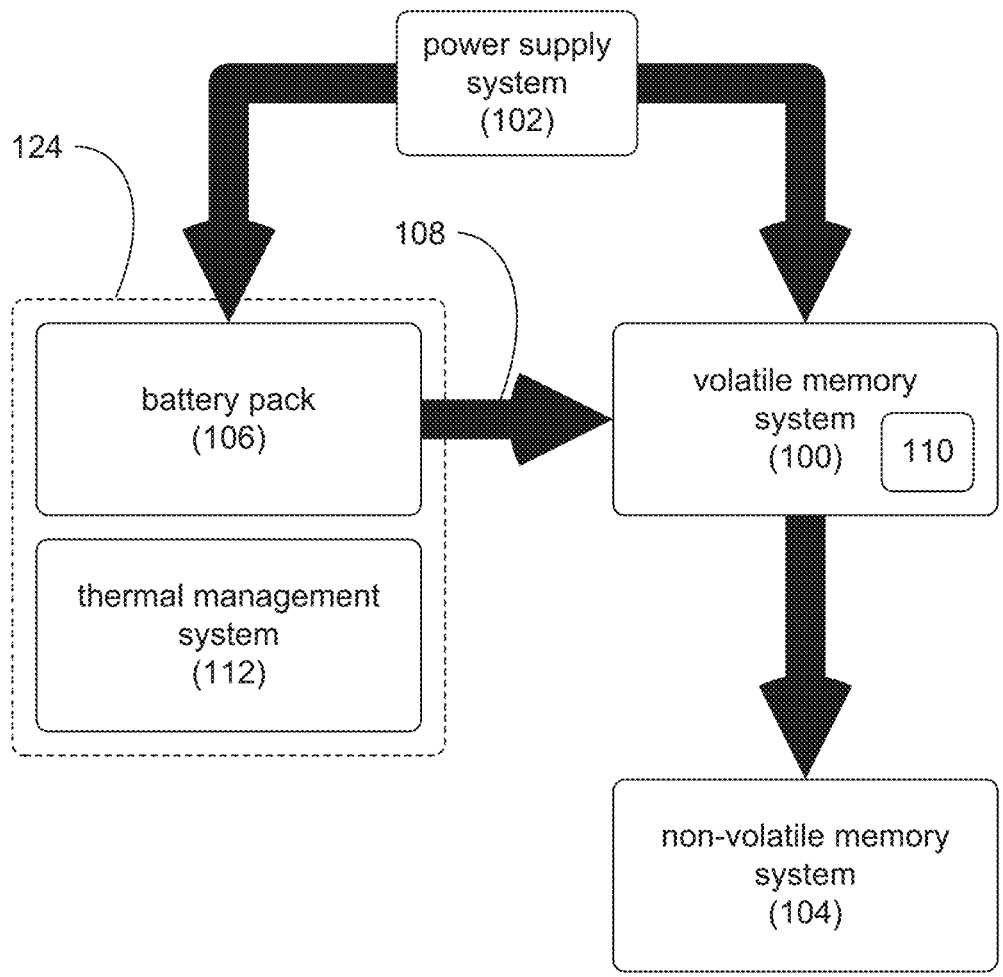
FIG. 3 is a diagrammatic view of the rack-mountable computing device of FIG. 2.

Referring also to FIG. 3, there is shown a general example of such an individual component. Assume for this example that rack-mountable computing device 50 is a processing component that includes volatile memory system 100. During normal operation, volatile memory system 100 may be powered by power supply system 102. In this particular example, rack-mountable computing device 50 may also include non-volatile memory system 104 and battery pack 106 (which may also be powered by power supply system 102). Examples of non-volatile memory system 104 may include but are not limited to flash memory systems and SSDs (i.e., solid state drives). An example of battery pack 106 may include but is not limited to a lithium-ion battery pack.

In the event that power supply 102 fails to provide electrical power to volatile memory system 100 (e.g., due to a power failure event), battery pack 106 may be configured to provide electrical power (electrical power 108) to volatile memory system 100 during this power failure event. For example, battery pack 106 may be configured to provide electrical power 108 to volatile memory system 100 during a data storage operation (e.g., the writing of vulnerable data that is currently stored within volatile memory system 100 onto non-volatile memory system 104.

Accordingly and continuing with the above-stated example, assume that during normal operation of rack-mountable computing device 50, data 110 may be temporarily written to volatile memory system 100 prior to being written to non-volatile memory system 104. For example, volatile memory system 100 may be a RAM-based cache memory system and non-volatile memory system 104 may be a portion of an SSD. Accordingly and if a power failure event is detected, battery pack 106 may continue to provide power (e.g., electrical power 108) to volatile memory system 100 for a period of time sufficiently long enough for rack-mountable computing device 50 to write data 110 from volatile memory system 100 to non-volatile memory system 104.

Unfortunately, the performance of battery pack 106 may be directly dependent upon the ambient temperature of battery pack 106 (since battery packs that are too cold do no perform well). Specifically, it is the nature of the electrolyte chemistry that results in the usable power (and energy level) of a lithium-ion battery pack to be substantially less at lower temperatures (e.g., 0° C.-15° C.) than at normal (e.g., room) temperature. Further, it may be unsafe to operate some lithium-ion battery packs when the temperature is too low (e.g., below 0° C.).

Accordingly, a thermal management system (e.g., thermal management system 112) may be utilized to maintain e.g., battery pack 106 within a temperature range (e.g., 5° C.-45° C. or 10° C.-35° C.) that allows for normal operation.

Figure 4:
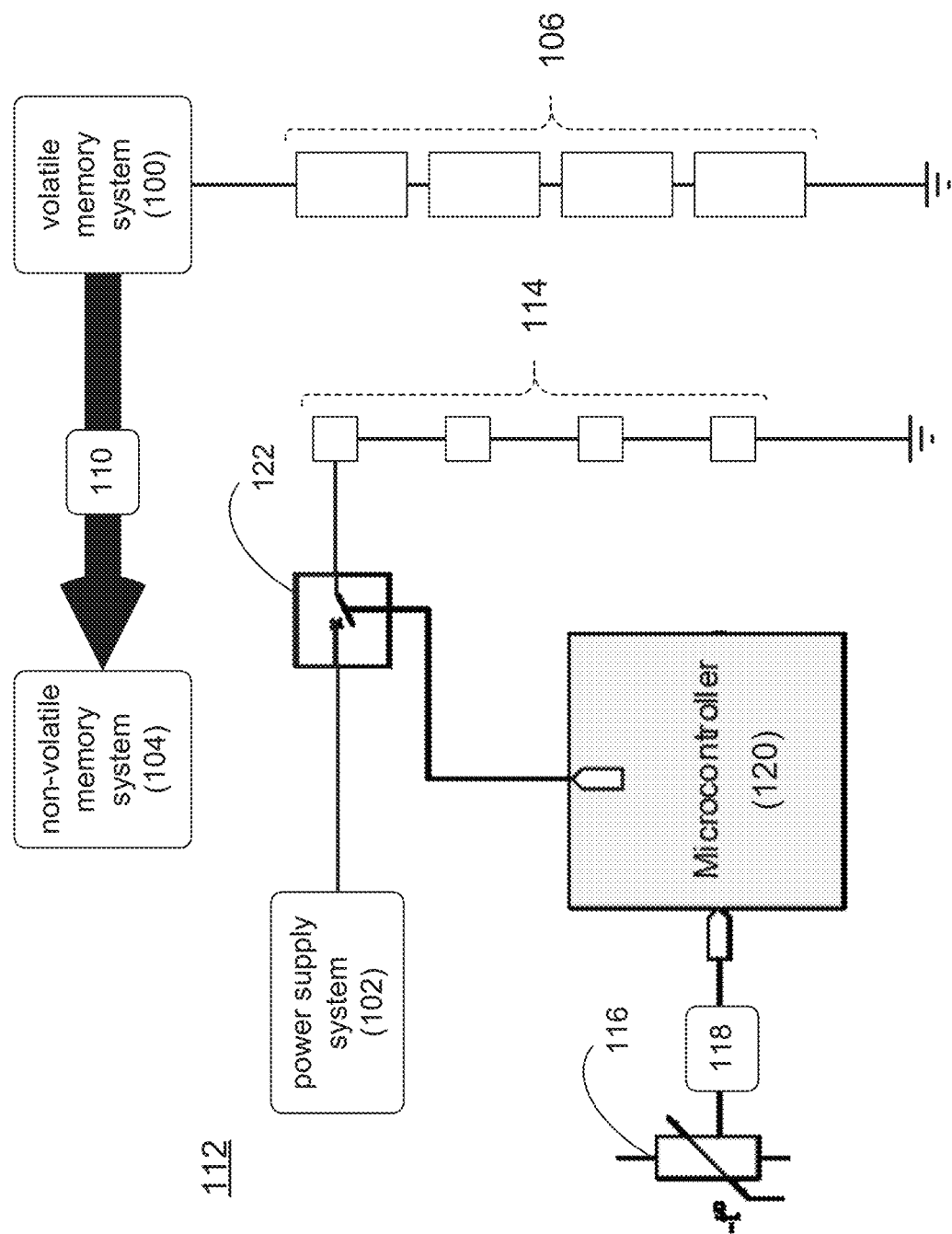
FIG. 4 is a detail view of a thermal management system for use within the rack-mountable computing device of FIG. 2.

Referring also to FIG. 4, thermal management system 112 may include one or more heating elements 114 (e.g., resistive heating elements) that are positioned proximate battery pack 106. While in this example, heating elements 114 are shown to include four discrete heating elements, this is for illustrative purposes only and is not intended to be a limitation of this disclosure, as the quantity of discrete heating elements may be increased or decreased depending upon the heating requirements of heating elements 114. Further, the thermal capacity of each of the discrete heating elements included within heating elements 114 may be increased or decreased depending upon the heating requirements of heating elements 114. Additionally and concerning the proximate location of heating elements 114 with respect to battery pack 106, heating elements 114 may be e.g., near, next to, or included within battery pack 106.

Thermal management system 112 may further include temperature sensor 116 that may be configured to determine a battery temperature (e.g., battery temperature 118) for battery pack 106. While in this example, battery pack 106 is shown to include four discrete batteries, this is for illustrative purposes only and is not intended to be a limitation of this disclosure, as the quantity of discrete batteries included within battery pack 106 may be increased or decreased depending upon the power requirements of volatile memory system 100.

Thermal management system 112 may further include controller 120 that may be configured to monitor battery temperature 118 via temperature sensor 116 so that the temperature of battery pack 106 may be maintained at a desired set point via heating elements 114. Specifically, controller 120 may be configured to compare battery temperature 118 to a desired set point. This desired set point may be a specific temperature or a range of acceptable temperatures. For example, assume that the set point for battery pack 106 is 25° C., wherein the acceptable operating temperature range is 23° C.-27° C.

Accordingly, controller 120 may compare battery temperature 118 to the desired set point (e.g., 25° C.) to determine whether or not heating elements 114 should be energized to maintain battery pack 106 within the acceptable operating temperature range is 23° C.-27° C. Specifically, controller 120 may repeatedly compare battery temperature 118 to the desired set point (e.g., 25° C.) at a defined frequency (e.g., once per second).

Continuing with the above-stated example in which the acceptable operating temperature range is 23° C.-27° C., controller 120 may be further configured to energize one or more heating elements 114 positioned proximate battery pack 106 to raise the temperature of battery pack 106 if battery temperature 118 is below the desired set point (e.g., 25° C.). Accordingly and when controller 120 compares battery temperature 118 to the desired set point (e.g., 25° C.), controller 120 may energize heating elements 114 to raise the temperature of battery pack 106 if battery temperature 118 is below the desired set point (e.g., 25° C.) or the lower end of the acceptable operating temperature range (e.g., 23° C.).

Continuing with the above-stated example in which the acceptable operating temperature range is 23° C.-27° C., controller 120 may be further configured to deenergize one or more heating elements 114 positioned proximate battery pack 106 if battery temperature 116 is at or above the desired set point (e.g., 25° C.). Accordingly and when controller 120 compares battery temperature 118 to the desired set point (e.g., 25° C.), controller 120 may deenergize heating elements 114 if battery temperature 118 is at or above the desired set point (e.g., 25° C.) or the upper end of the acceptable operating temperature range (e.g., 27° C.).

When energizing (or deenergizing) one or more heating elements 114, controller 120 may energize (or deenergize) relay 122 to apply power to (or remove power from) one or more heating elements 114.

Figure 5:
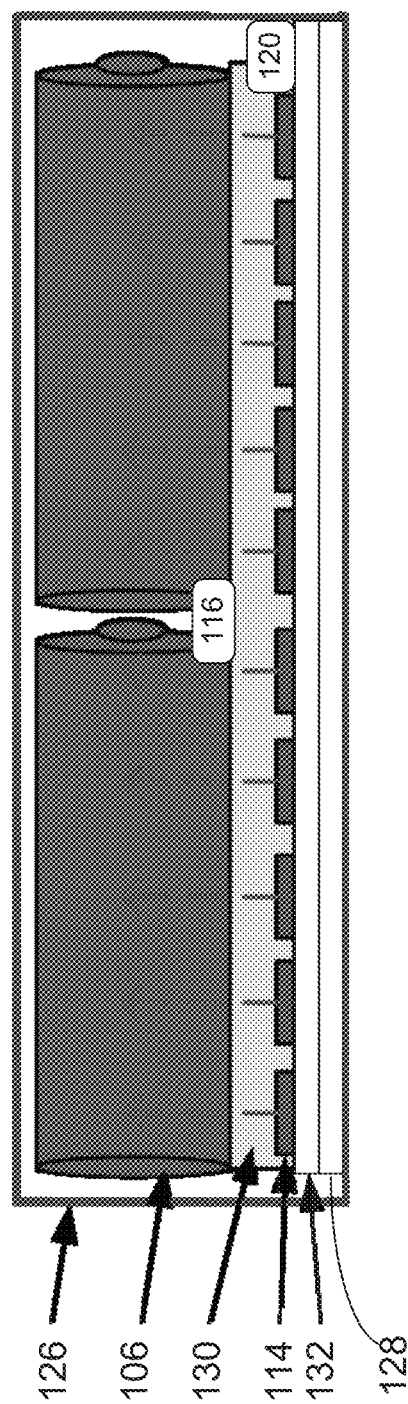
FIG. 5 is a detail view of the thermal management system of FIG. 4.

Referring also to FIG. 5, battery pack 106, one or more heating elements 114, temperature sensor 116, and controller 120 may be included within battery module 124, wherein battery module 124 may include outer protective layer 126. An example of outer protective layer 126 may include but is not limited to a shrink wrap protective layer. Further, by packaging battery pack 106, one or more heating elements 114, temperature sensor 116, and controller 120 within battery module 124, battery module 124 may be easily removed and replaced within e.g., rack-mountable computing device 50 as an easily serviceable single unit.

Printed circuit board 128 may be configured to position one or more heating elements 114 proximate battery pack 106, wherein thermally-conductive pad 130 may be positioned between one or more heating elements 114 and battery pack 106 (to aid in the warming of battery pack 106) and thermally-insulating pad 132 may be positioned between one or more heating elements 114 and printed circuit board 128 (to prevent the warming of printed circuit board 128).

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A thermal management system comprising:
   one or more heating elements positioned proximate a battery pack;
   a printed circuit board configured to position the one or more heating elements proximate the battery pack;
   a thermally-insulating pad positioned between the one or more heating elements and the printed circuit board;
   a temperature sensor configured to determine a battery temperature for the battery pack; and
   a controller configured to:
      compare the battery temperature to a desired set point, and
      if the battery temperature is below the desired set point, energize the one or more heating elements positioned proximate the battery pack to raise the temperature of the battery pack.

2. The thermal management system of claim 1 wherein the controller is further configured to:
   deenergize the one or more heating elements positioned proximate the battery pack if the battery temperature is at or above the desired set point.

3. The thermal management system of claim 1 further comprising:
   a thermally-conductive pad positioned between the one or more heating elements and the battery pack.

4. The thermal management system of claim 1 wherein the battery pack is a lithium-ion battery pack.

5. The thermal management system of claim 1 wherein the battery pack is configured to provide electrical power to a volatile memory system during a data storage operation.

6. The thermal management system of claim 1 wherein the battery pack is configured to provide electrical power to a volatile memory system in the event of a power failure event.

7. The thermal management system of claim 1 wherein the one or more heating elements are resistive heating elements.

8. The thermal management system of claim 1 wherein the battery pack, the one or more heating elements, the temperature sensor and the controller are included within a battery module.

9. The thermal management system of claim 8 wherein the battery module includes an outer protective layer.

10. The thermal management system of claim 1 wherein comparing the battery temperature to a desired set point includes:
    repeatedly comparing the battery temperature to the desired set point at a defined frequency.

11. A thermal management system comprising:
    one or more heating elements positioned proximate a battery pack;
    a printed circuit board configured to position the one or more heating elements proximate the battery pack;
    a thermally-insulating pad positioned between the one or more heating elements and the printed circuit board;
    a temperature sensor configured to determine a battery temperature for the battery pack; and
    a controller configured to:
       compare the battery temperature to a desired set point,
       if the battery temperature is below the desired set point, energize the one or more heating elements positioned proximate the battery pack to raise the temperature of the battery pack, and
       if the battery temperature is at or above the desired set point, deenergize the one or more heating elements positioned proximate the battery pack.

12. The thermal management system of claim 11 wherein the battery pack is a lithium-ion battery pack.

13. The thermal management system of claim 11 wherein the battery pack is configured to provide electrical power to a volatile memory system during a data storage operation.

14. The thermal management system of claim 11 wherein the battery pack is configured to provide electrical power to a volatile memory system in the event of a power failure event.

15. The thermal management system of claim 11 wherein the one or more heating elements are resistive heating elements.

16. A battery module comprising:
    a lithium-ion battery pack;
    one or more heating elements positioned proximate the lithium-ion battery pack;
    a printed circuit board configured to position the one or more heating elements proximate the lithium-ion battery pack;
    a thermally-insulating pad positioned between the one or more heating elements and the printed circuit board;
    a temperature sensor configured to determine a battery temperature for the lithium-ion battery pack; and
    a controller configured to:
       compare the battery temperature to a desired set point; and
       if the battery temperature is below the desired set point, energize the one or more heating elements positioned proximate the battery pack to raise the temperature of the lithium-ion battery pack.

17. The battery module of claim 16 further comprising:
    a thermally-conductive pad positioned between the one or more heating elements and the lithium-ion battery pack.

* * * * *